United States Patent [19]

Takahashi

[11] 4,165,495
[45] Aug. 21, 1979

[54] CIRCUIT SYSTEM FOR REPRODUCING A SIGNAL FROM A MOVING RECORD CARRIER

[75] Inventor: Hiroo Takahashi, Chigasaki, Japan

[73] Assignee: Sony Corporation, Tokyo, Japan

[21] Appl. No.: 920,676

[22] Filed: Jun. 30, 1978

[30] Foreign Application Priority Data

Jul. 20, 1977 [JP] Japan ................... 52-86999

[51] Int. Cl.² .......................... H03G 9/26; G11B 7/00
[52] U.S. Cl. .................... 330/283; 330/133; 330/303; 330/304; 333/18; 358/8; 360/65
[58] Field of Search ............... 330/303, 304, 283, 278, 330/133; 358/8, 27, 174; 333/18; 360/24, 25, 36, 65, 67, 68

[56] References Cited

U.S. PATENT DOCUMENTS 3,541,237 11/1970 Dillenburger .......................... 358/8
3,643,013 2/1972 Lemoine ............................. 360/65 X Primary Examiner—James B. Mullins Attorney, Agent, or Firm—Lewis H. Eslinger; Alvin Sinderbrand

[57] ABSTRACT

A circuit for reproducing a signal from a moving record carrier includes a circuit input supplied with a signal read out from the moving record carrier, for example, a record disc having a spiral track in which the signal is recorded, and in which the signal has variations in its level due to the shift of reading out position on the carrier. The signal from the input is supplied to an automatic gain control loop including a gain control circuit and a gain control signal generating circuit connected to the output of the gain control circuit for producing a gain control signal varying in response to the level of the read out signal. The gain control signal is supplied to the gain control circuit for controlling the gain thereof and is also supplied to a variable gain amplifier, for example, an equalizing amplifier, which also receives the output signal from the gain control circuit and has a variable gain-frequency characteristic which is controlled in response to the gain control signal and which varies in correspondence with the frequency of the signal applied thereto to be amplified.

8 Claims, 9 Drawing Figures

CIRCUIT SYSTEM FOR REPRODUCING A SIGNAL FROM A MOVING RECORD CARRIER

BACKGROUND OF THE INVENTION

1. Field of the Invention

This invention relates generally to a signal reproducing circuit for reproducing a signal read out from a moving record carrier, and more particularly to a gain control circuit for controlling the gain of a circuit included therein for amplifying a signal from a record carrier in response to a position on the carrier where the signal is read out.

2. Description of the Prior Art

In the art then exist various types of signal recording carriers and apparatus for reproducing signals from these signal record carriers. One of these record carriers includes, a rotatable disc, on which a signal, such as a frequency-modulated (FM) video and audio signal, is recorded in a spiral track which travels from the periphery to the inside portion of the disc. The spiral track is formed with a plurality of small pits or bumps in alignment along the rotational direction of the disc and on the surface of the disc. The spaces between respective adjacent pits or bumps on the spiral track are varied in response to the frequency-modulated signal to be recorded. In the case of a video signal, one revolutionary path of the spiral track is typically given a recorded signal corresponding to one frame of the video signal. The length of each path or circle of the spiral track is different from the length of the next adjacent path or circle, that is the length of one circle elongates gradually to the peripheral portion from the central portion of the disc. This results in the dimensions of the pits or bumps and the space between respective adjacent pits or bumps on each circle of the spiral track being gradually increased toward to the peripheral portion from the central portion of the disc.

With the above-described record disc, one method for reproducing signals therefrom is by use of a laser light beam. In the reproduction, the recorded disc is rotated and the laser light beam of a constant diameter is impinged on the surface of the rotating disc so as to trace the spiral track on which the signal is recorded in the form of the alignment of pits or bumps. The laser light beam tracing the spiral track is modulated to have variations in accordance with the alignment of pits or bumps and reflected there to be directed to a photo-sensing device. The photosensing device generates a reproduced signal in response to the variations in the reflected laser light beam.

As mentioned above, each dimension of the pit or bump and the space between respective adjacent pits or bumps is increased gradually to the peripheral portion from the central portion of the disc. In this manner, each pit or bump at the peripheral portion of the disc is larger than that at the central portion of the disc and the space between respective adjacent pits or bumps at the peripheral portion of the disc is also larger than that at the central portion of the disc even if the same signal is recorded at both portions. Accordingly, although the contour of each pit or bump at the peripheral portion can be distinctly detected by the laser light beam tracing the spiral track, the contour of each pit or bump at the central portion can not be distinguished correctly by the laser light beam because the dimension of each of the pits or bumps thereat and the space therebetween do not become sufficiently large as compared with the diameter of the laser light beam. This means that the maximum high frequency of reproduced signal is reduced gradually to the central portion from the peripheral portion of the disc and the recorded signal at the central portion is reproduced with poor fidelity, that is, the reproduced signal, especially a reproduced video signal at the central portion is deteriorated in the quality of its frequency response and a reproduced image on a reproducing apparatus is deteriorated in resolution.

SUMMARY OF THE INVENTION

The present invention is provided to eliminate the above mentioned defects or disadvantages inherent in the prior art reproducing systems using a moving record carrier such as a rotatable disc.

An object of the present invention is to provide an improved signal reproducing circuit for reproducing a signal from a moving record carrier in which deteriorations in quality of a reproduced signal introduced due to the recorded position on the carrier are compensated for.

Another object of the present invention is to provide a signal reproducing circuit suitable for reproducing a signal from a rotatable disc on which the signal is recorded in a spiral record track.

A further object of the present invention is to provide a signal reproducing circuit used for reproducing a signal from a rotatable disc having a spiral signal record track thereon, which compensates for deterioration in quality of frequency response introduced into the reproduced signal gradually as the position on the track moves to the central portion from the peripheral portion of the disc.

A still further object of the present invention is to provide a gain control circuit for controlling a gain of a circuit for amplifying a signal read out from a rotatable disc having a spiral record track from thereon in response to a position on the track where the signal is read out.

In accordance with an aspect of this invention, a circuit cystem for reproducing a signal from a moving carrier comprises a circuit system input to which a signal read out from the moving record carrier is supplied with variations in the level being introduced due to the shift of a reading out position on the carrier, and an automatic gain control circuit loop connected to the input, the circuit loop including a gain conrol circuit supplied with the read out signal and a gain control signal generating circuit connected to an output of the gain control circuit for producing a gain control signal varying in response to the level of the read out signal supplied to the gain control circuit and supplying the gain control signal to the gain control circuit for automatically controlling the gain thereof. The reproducing circuit system further includes a variable gain amplifier circuit having a variable gain-frequency characteristic varying in correspondence with the frequency of a signal applied thereto to be amplified, the variable gain amplifier circuit being connected to the output of the gain control circuit and being supplied with the gain control signal produced in the automatic gain control circuit loop to be controlled in its variable gain-frequency characteristic in response to the gain control signal, and a circuit system output connected to the output of the variable gain amplifier circuit to derive thereat the read out signal compensated for variations in level.

The above, and other, objects, features and advantages of the invention will be apparent in the following detailed description of the illustrative embodiment of the invention which is to be read in conjunction with the accompanying drawings.

DESCRIPTION OF THE PREFERRED EMBODIMENT

For the purpose of introduction and an easy understanding of the present invention, a rotatable disc, which has been previously proposed as one of the moving signal record carriers, can be used with the present invention, and an apparatus previously proposed for reproducing a signal from the rotatable disc will be briefly described with reference to FIGS. 1 to 3.

The use of a signal record carrier of the video disc type is known in the art. This signal record carrier includes a disc shaped sheet having thereon a spirally formed record track which is formed from the peripheral portion to the inside portion of the disc and on the spiral track there is recorded a video signal which is frequency-modulated (FM).

Figure 1:
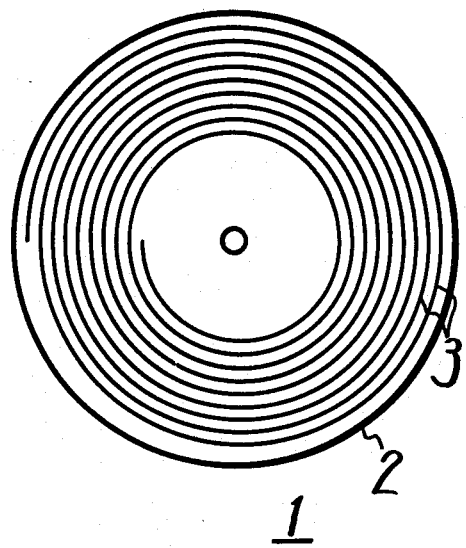
FIG. 1 is a schematic top plan view of a rotatable disc having a spiral signal record track thereon.
Figure 2:
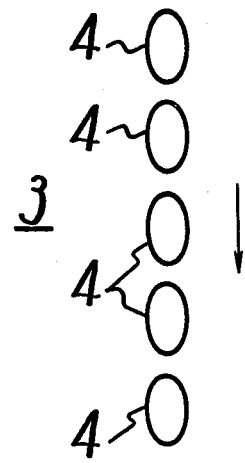
FIG. 2 is a schematic top plan view of a part of the signal record track on the rotatable disc shown in FIG. 1 illustrating the pits or bumps for recording a signal thereon.

With reference to FIGS. 1 and 2 such a video disc will be described. In FIG. 1, reference numeral 1 generally designates a video disc, 2 its sheet proper, and 3 a spiral record track, respectively. This spiral record track 3 is formed of recesses or projections 4 which are termed pits or bumps, each having an oval shape and aligned along the rotational direction of the video disc 1, as shown in FIG. 2. The length of each pit or bump 4 and the space between respective adjacent pits or bumps 4 are varied in response to the frequency modulated video signal. In the present apparatus, one rotation of the video disc 1 is preferably selected to correspond to, for example, one frame interval or period of the video signal.

Figure 3:
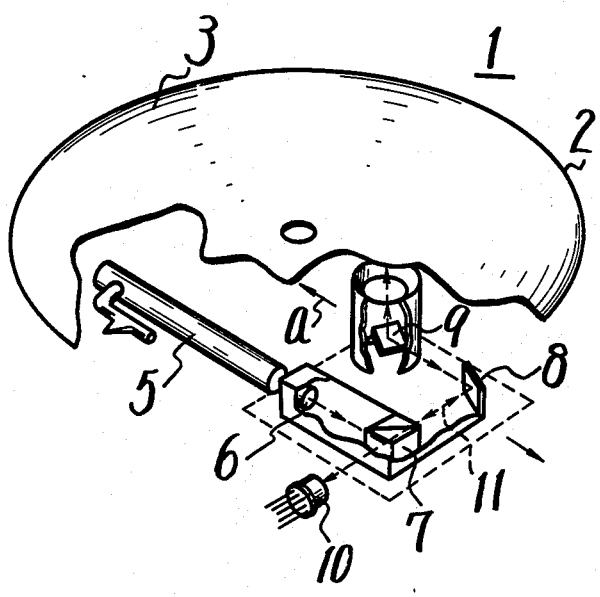
FIG. 3 is a schematic perspective view of a portion of a conventional disc reproducing apparatus using a laser light beam for reading out information recorded on the disc.

The above video signal, which is frequency-modulated and recorded on the video disc 1, is reproduced by a conventional disc reproducing apparatus, one part of which is shown in FIG. 3. In FIG. 3, a laser light beam 11 generated from a laser light beam generator 5 is irradiated or transmitted through a lens 6, a semi-transparent prism 7, a mirror 8 and a movable mirror 9 onto the rear surface of the video disc 1 at its spiral record track 3 with a sharply focussed point having the diameter of, for example, about 1μ (micron). The laser beam reflected from the video disc 1 arrives at the semi-transparent prism 7 through the same path as it arrived at the video disc 1 but in the reverse direction and then reaches a photo-sensing device such as a photo diode 10 from the semi-transparent prism 7, where the received laser beam is converted to the frequency modulated video signal. The laser light generator 5, lens 6, semi-transparent prism 7, mirror 8 and movable mirror 9 are all moved in the direction indicated by the arrow a, so that the laser beam 11 traces the spiral record track 3 from the peripheral portion to the inside portion of the video disc 1 as the video disc 1 rotates.

Figure 4:
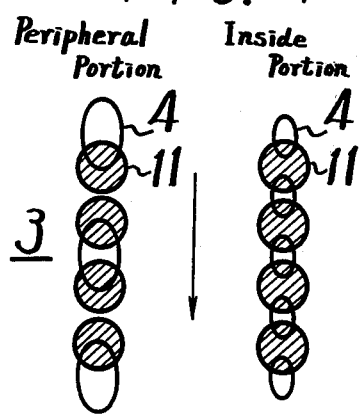
FIG. 4 is a schematic illustration showing the pits or bumps and is used for explaining the operation of the apparatus shown in FIG. 3.
Figure 5:
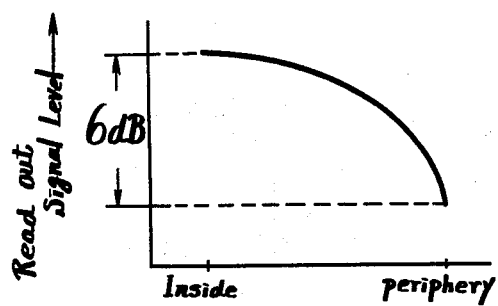
FIGS. 5 and 6 are graphical diagrams used for explaining the reproduction of a signal from the rotatable disc shown in FIG. 1.

The dimension or length of each of the pits or bumps 4 on the inside portion of the video disc 1 becomes smaller than that on the peripheral portion of the video disc 1 as shown in FIG. 4. If the laser beam with the same diameter is irradiated on the pits or bumps 4 on the inside and peripheral portions of the video disc 1, the contour of the pits or bumps 4 on the peripheral portion of the video disc 1 can be clearly detected, but that of the pits or bumps 4 on the inside portion of the video disc 1 are not so clear and hence, can not be clearly detected because the lengths of the pits or bumps 4 on the inside portion of the video disc 1 are smaller than the diameter of the laser beam 11. In other words, the frequency limit in the in higher frequency band on the record track in the inside portion of the video disc 1, which frequency can be read, becomes remarkably lower than that on the record track in the peripheral portion of the video disc 1 which can also be read. Accordingly, if the frequency modulated carrier frequency is, for example, 8 $MH_z$, the components in the upper side band, in which the video signal component of a reproduced signal is contained, are suppressed to a relatively low value. For example, if the component with the frequency modulated carrier frequency of 8 $MH_z$ in the reproduced or read out signal is amplified a difference of about 6 dB between the inside and peripheral portions of the video disc 1 results as shown in the graph of FIG. 5.

Therefore, if the reproduced video signal is fed to an image receiving apparatus such as a television receiver, a reproduced picture has resolution deteriorated near the inside portion of video disc and hence, the reproduced picture is unsatisfactory. The variation in the frequency characteristics beween the inside and peripheral portions of the video disc 1 will appear in the form of amplitude variation of a color burst signal in the reproduced video signal or absolute value variation of the amplitude of the frequency modulated signal.

Figure 6:
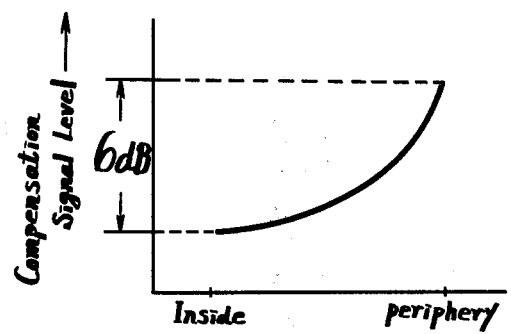

In order to avoid this defect, prior art devices have proposed a method wherein the amplitude variation of the color burst portion of in the reproduced video signal, which is suppressed at a constant level because it is frequency-modulated, is first detected, or the position of the laser beam corresponding to the video disc is detected, by a potentio-meter. A compensation signal having a characteristic opposite to that shown in the graph of FIG. 5 is provided from the detected signal are as shown in the graph of FIG. 6, and this compensation signal is added to the reproduced video signal to compensate for the amplitude variation of the reproduced video signal. In these prior art devices however, it is necessary that the compensation signal be produced such that it varies in response to the positions of the laser beam on the inside and peripheral portions of the video disc and that the relation between the frequency characteristics of the compensation signal and the reproduced video signal be determined, which is very complicated.

In a view of the above problems in the prior art, the present invention provides a signal reproducing circuit system which is simple in construction and has a gain compensation circuit for easily and positively compensating for the frequency characteristic of a reproduced video signal. One embodiment of the signal reproducing circuit system according to the present invention will be described with reference to FIG. 7 which shows the case where the signal reproducing circuit system of the invention is applied to a video disc similar to that described above.

Figure 7:
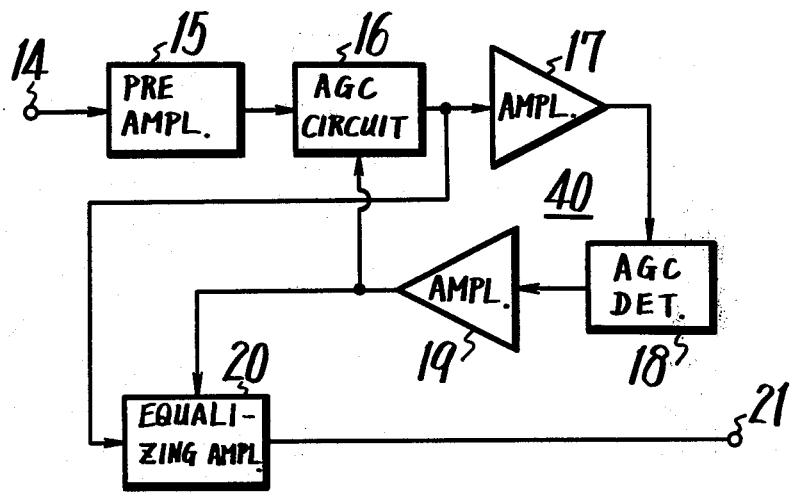
FIG. 7 is a schematic block diagram showing one embodiment of a signal reproducing circuit in accordance with the present invention.

In FIG. 7, reference numeral 14 designates an input terminal to which a frequency modulated signal with the carrier frequency of, for example, 8 MHz, containing a video signal component reproduced from a record carrier (for example, a video disc) is applied. This frequency modulated signal is fed to a pre-amplifier 15 to be amplified and then applied to an automatic gain control (AGC) circuit 16. The output signal from the AGC circuit 16 which is controlled in level is supplied to an equalizing amplifier circuit 20 and also to an amplifier 17. The output signal from the amplifier 17 is fed to an AGC detector circuit 18 to be detected. A DC voltage signal from the detector circuit 18, which is obtained by the detection of the signal from amplifier 17 and which is varied in response to the level of the input signal to the amplifier 17, is fed to an amplifier 19 and the amplified output signal from the amplifier 19 is supplied to the AGC circuit 16 as its AGC control signal. In other words, the AGC circuit 16, AGC detector circuit 18 and DC amplifier 19 form an AGC loop 40. The control signal for the AGC circuit 16 from the DC amplifier 19 is also supplied to the equalizing amplifier circuit 20, as its frequency characteristic compensation signal in which circuit 20 serves as a frequency characteristic compensation circuit. The signal, which is compensated for in its frequency characteristic by the equalizing amplifier circuit 20, is delivered to an output terminal 21 which is led out from the equalizing amplifier circuit 20. This equalizing amplifier circuit 20, which is controlled with the same control signal for the AGC circuit 16, is the gain compensation circuit which is the essential feature of the present invention.

Figure 8:
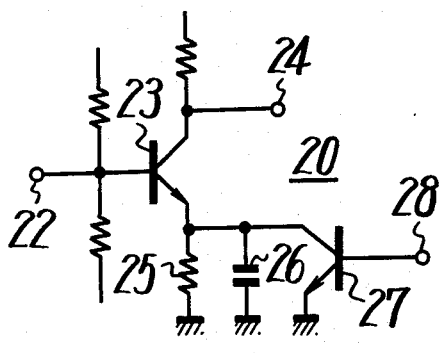
FIG. 8 is a circuit wiring diagram showing the equalizing amplifier circuit of the signal reproducing circuit shown in FIG. 7.

FIG. 8 is a circuit diagram showing a practical embodiment of the equalizing amplifier circuit 20. In FIG. 8, an input terminal 22 is connected to the base of a transistor 23 for amplification and an output terminal 24 is led out from the collector of the transistor 23. The emitter of the transistor 23 is grounded through a parallel circuit consisting of a resistor 25 and a capacitor 26 and is also grounded through the collector-emitter path of a transistor 27. A terminal 28, which is supplied with the control signal from the DC amplifier 19 (refer to FIG. 7), is connected to the base of the transistor 27.

In the circuit of FIG. 8, the control signal fed to the terminal 28 is applied to the base of the transistor 27, so that the impedance between the collector and emitter of the transistor 27 is gradually varied with the control signal. Further, since the capacitor 26 is connected in parallel to the collector-emitter path of the transistor 27, the frequency characteristic of the equalizing amplifier circuit 20 is varied gradually with the control signal.

Figure 9:
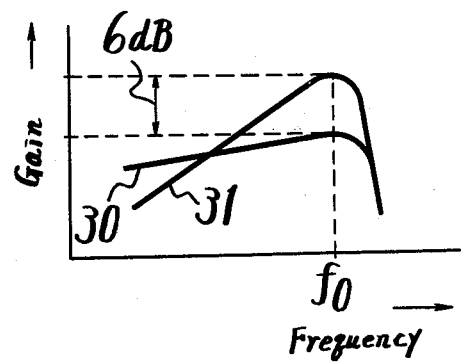
FIG. 9 is a graphical diagram used for explaining the operation of the signal reproducing circuit in accordance with the present invention.

FIG. 9 is a graph showing the characteristics of the gain compensation circuit of the signal reproducing circuit according to the invention. In this regard, the control signal for the AGC circuit 16 is supplied to the gain compensation circuit to 20 produce a gain-frequency characteristic of the signal reproducing circuit that is approximately flat, as shown by curve 30 in the graph of FIG. 9, when a signal is reproduced from the record track on the peripheral portion of the video disc. In contrast when a signal is reproduced from the record track on the inside portion of the video disc, the gain-frequency characteristic of the signal reproducing circuit produces a a characteristic that has a peak value at a frequency $f_o$ (which is 12.5 MHz in the illustrated example) and is emphasized at high frequencies as indicated by curve 31 in the graph of FIG. 9. With the signal reproducing circuit of the present invention, the gain-frequency characteristic thereof changes rapidly from that of the curve 30 to that of the curve 31 by the control signal for the AGC circuit 16 in correspondence with the trace from the peripheral portion to the inside portion of the record track on the video disc so as to obtain a good reproduced signal irrespective of the read out position at the peripheral or inside portions of the record track on the video disc.

According to the gain compensation circuit of the signal reproducing circuit of the present invention, to which a reproduced signal from the record carrier is supplied, there is provided the AGC circuit 16 and the frequency characteristic compensation circuit 20, wherein the frequency characteristic compensation circuit is controlled by the control signal for the AGC circuit 16 from the amplifier 19. Thus, the frequency characteristic of a signal such as a reproduced video signal from a record carrier, for example a video disc or the like, whose frequency characteristic is varied gradually, can be suitably compensated for.

In the above discussion although, the video disc is shown as the record carrier, but it will be apparent that the video disc need not be limited to a optical apparatus, but may be used with an apparatus, in which a signal is reproduced according to variations of capacity, pressure or magnetizm. Further, the record carrier may be a magnetic sheet, magnetic tape, magnetic drum or the like. Also, the reproduced signal from the record carrier need not be limited to a video signal, but various kinds of signals such as an audio signal or the like frequency characteristic of which is varied gradually, can be used as the reproduced signal.

Further, although the above laser beam has a constant spot diameter, the signal reproducing circuit of the present invention can be applied to a system where the frequency characteristic thereof is deriorated by a variation of the spot diameter or by a non-focused laser beam upon reproducing to compensate for the deterioration of the frequency characteristic.

Having described a specific preferred embodiment of the invention with reference to the accompanying drawings, it is to be understood that the invention is not limited to that precise embodiment, and that various changes and modifications may be effected therein by one skilled in the art without departing from the scope or spirit of the invention as defined in the appended claims.

I claim as my invention:

1. A circuit system for reproducing a signal from a moving record carrier comprising:
   (a) a circuit input to which is supplied a signal read out from the moving record carrier with variations in the level introduced due to the shift of a reading out position on the carrier;
   (b) an automatic gain control circuit loop connected to said input, said circuit loop including a gain control circuit supplied with said read out signal and a gain control signal generating circuit connected to an output of said gain control circuit for producing a gain control signal varying in response to the level of said read out signal supplied to said gain control circuit and supplying said gain control signal to said gain control circuit for automatically controlling the gain thereof;
   (c) a variable gain amplifier circuit having a variable gain-frequency characteristic varying in correspondence with the frequency of a signal applied thereto to be amplified, said variable gain amplifier circuit being connected to the output of said gain control circuit and being supplied with said gain control signal produced in said automatic gain control circuit loop to be controlled in its variable gain-frequency characteristic in response to said gain control signal; and
   (d) a circuit system output connected to the output of said variable gain amplifier circuit to derive thereat the read out signal compensated for said variations in the level.

2. A circuit system according to claim 1, wherein said variable gain amplifier circuit includes an equalizing amplifier having a variable gain-frequency characteristic.

3. A circuit system according to claim 2; wherein said equalizing amplifier includes a first transistor having an input terminal connected to the output of said gain control circuit and further having an output terminal connected to said circuit system output, and a second transistor having an input terminal supplied with said gain control signal.

4. A circuit system according to claim 3; wherein said first transistor is a bi-polar junction transistor having a base and a collector constituting said input terminal and said output terminal, of said first transistor; said second transistor is a bi-polar junction transistor having a base constituting said input terminal thereof, said second transistor further having an emitter connected to a ground potential and a collector connected to the emitter of said first transistor; said equalizing amplifier further including a resistor and a capacitor connected in parallel between said emitter of said first transistor and said ground potential.

5. A circuit system according to claim 1; wherein said gain control signal generating circuit includes a gain control detector circuit supplied with said output from said gain control circuit for producing a DC voltage signal which is varied in response to the level of said output from said gain control circuit.

6. A circuit system according to claim 5; wherein said gain control signal generating circuit includes a first amplifier interposed between said detector circuit and said gain control circuit and a second amplifier supplied with said DC voltage signal for producing said gain control signal.

7. A circuit system according to claim 1; wherein said record carrier is a rotatable disc having a spiral track thereon which runs from the peripheral portion of the disc toward the center portion of the disc and has a signal recorded therein; and wherein said variations in level occur between signals recorded in said spiral track at different radial distances from the center of said disc.

8. A circuit system according to claim 1; wherein said gain-frequency characteristic of said variable gain amplifier circuit corresponds to a curve representing an approximately constant gain for all recorded frequencies when a signal is reproduced from a peripheral portion of said spiral track and a curve representing a gain emphasized at high frequencies when said signal is reproduced from a central portion of said spiral track.

* * * * *